US012803519B2

(12) United States Patent
Kuroyanagi et al.

(10) Patent No.: US 12,803,519 B2
(45) Date of Patent: Nov. 17, 2026

(54) ACOUSTIC WAVE FILTER, FILTER CIRCUIT, AND RADIO-FREQUENCY MODULE

(71) Applicant: Murata Manufacturing Co., Ltd., Kyoto (JP)

(72) Inventors: Takuma Kuroyanagi, Kyoto (JP); Shun Harada, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 91 days.

(21) Appl. No.: 18/919,932

(22) Filed: Oct. 18, 2024

(65) Prior Publication Data

US 2025/0247067 A1 Jul. 31, 2025

(30) Foreign Application Priority Data

Jan. 26, 2024 (JP) ................................ 2024-010257

(51) Int. Cl.
*H03H 9/00* (2006.01)
*H03H 9/64* (2006.01)

(52) U.S. Cl.
CPC ........ *H03H 9/0009* (2013.01); *H03H 9/6483* (2013.01)

(58) Field of Classification Search
CPC .... H03H 9/0009; H03H 9/6483; H03H 9/605; H03H 9/64; H03H 9/171; H03H 9/25; H03H 9/54; H03H 9/725; H03H 9/145; H03H 9/542; H03H 9/568; H03H 9/72; H03H 9/02574; H03H 9/02559; H03H 9/14541; H03H 9/02228; H03H 9/706; H03H 9/205; H03H 9/6403; H03H 9/02992; H03H 9/02015; H03H 9/1457; H03H 9/02157; H03H 9/02834; H03H 9/14544; H03H 9/132; H03H 9/6436; H03H 9/6489; H03H 9/70; H03H 9/13; H03H 9/175; H03H 9/564; H03H 9/02866;

(Continued)

(56) References Cited

U.S. PATENT DOCUMENTS

2012/0086524 A1* 4/2012 Komura ................ H03H 9/725 333/195
2012/0286896 A1* 11/2012 Takamine ............. H03H 9/725 333/195

(Continued)

FOREIGN PATENT DOCUMENTS

JP 2018-088675 A 6/2018

*Primary Examiner* — John W Poos
(74) *Attorney, Agent, or Firm* — McDonald Hopkins LLC

(57) ABSTRACT

An acoustic wave filter includes a serial arm resonator disposed on a serial arm path connecting input/output terminals, and a parallel-arm resonator device connected between the serial arm path and the ground. The serial arm resonator is a first acoustic wave resonator. The parallel-arm resonator device includes a parallel arm resonator and an inductor connected in series between the serial arm path and the ground. The serial arm resonator and the parallel arm resonator are on the same piezoelectric substrate. The resonant frequency of the parallel-arm resonator device is lower than or equal to the low frequency end of the passband of the acoustic wave filter. The anti-resonant frequency of the parallel-arm resonator device is higher than or equal to the high frequency end of the passband.

11 Claims, 7 Drawing Sheets

(58) Field of Classification Search
CPC ............. H03H 9/0542; H03H 9/02637; H03H 9/02031; H03H 9/14538; H03H 9/6433; H03H 9/17; H03H 9/174; H03H 7/38; H03H 9/173; H03H 9/02818; H03H 9/176; H03H 9/6496; H03H 9/0576; H03H 9/562; H03H 9/6406; H03H 9/703; H03H 9/1452; H03H 9/14526; H03H 9/02086; H03H 9/6476; H03H 7/0161; H03H 7/1766; H03H 9/0274; H03H 9/14547; H03H 9/059; H03H 9/14594; H03H 9/0557; H03H 9/6409; H03H 9/02007; H03H 7/0115; H03H 7/463; H03H 7/075; H03H 9/02858; H03H 9/02881; H03H 3/08; H03H 9/02543; H03H 7/01; H03H 7/46; H03H 9/14502; H03H 9/133; H03H 9/1071; H03H 7/1758; H03H 9/0222; H03H 9/131; H03H 2007/013; H03H 2210/036; H03H 9/02102; H03H 7/175; H03H 9/14532; H03H 9/14573; H03H 2210/025; H03H 9/02; H03H 9/02062; H03H 9/14558; H03H 9/6479; H03H 7/1708; H03H 9/0211; H03H 9/02929; H03H 9/02937; H03H 9/0547; H03H 9/14552; H03H 9/6423; H03H 9/6426; H03H 2210/012; H03H 9/02118; H03H 9/14582; H03H 9/58; H03H 9/6493; H03H 3/10; H03H 9/02614; H03H 9/0561; H03H 2250/00; H03H 9/02842; H03H 9/02952; H03H 9/058; H03H 9/1085; H03H 9/14588; H03H 9/547; H03H 2007/386; H03H 9/0004; H03H 9/0071; H03H 9/02661; H03H 9/02984; H03H 9/1064; H03H 9/14561; H03H 9/52; H03H 9/545; H03H 9/587; H03H 9/6413; H03H 7/0153; H03H 9/0028; H03H 9/02535; H03H 9/02732; H03H 9/0523; H03H 9/0566; H03H 9/1092; H03H 9/6453; H03H 9/6469; H03H 7/461; H03H 9/0085; H03H 9/02149; H03H 9/02275; H03H 9/02771; H03H 9/14514; H03H 9/14517; H03H 9/14591; H03H 9/15; H03H 9/46; H03H 3/02; H03H 7/0138; H03H 9/009; H03H 9/02889; H03H 9/0552; H03H 9/0571; H03H 9/1014; H03H 9/1455; H03H 9/14576; H03H 9/566; H03H 9/589; H03H 9/66; H03H 2009/02299; H03H 7/12; H03H 7/1783; H03H 7/18; H03H 7/19; H03H 7/465; H03H 9/0095; H03H 9/02708; H03H 9/02826; H03H 9/02913; H03H 9/02944; H03H 9/0504; H03H 9/14564; H03H 9/465; H03H 9/56; H03H 9/582; H03H 9/6456; H03H 9/68; H03H 11/04; H03H 2001/0078; H03H 2003/021; H03H 2003/0428; H03H 2009/02165; H03H 2009/02173; H03H 2210/015; H03H 2210/02; H03H 7/09; H03H 9/02055; H03H 9/02566; H03H 9/02685; H03H 9/02897; H03H 9/05; H03H 9/0585; H03H 9/1035; H03H 9/1042; H03H 9/14508; H03H 9/177; H03H 9/44; H03H 9/6416; H03H 9/6463; H03H 9/6486; H03H 19/00; H03H 2003/023; H03H 2003/0435; H03H 2003/0442; H03H 2009/02204; H03H 2210/026; H03H 3/04; H03H 7/20; H03H 7/42; H03H 9/0014; H03H 9/0047; H03H 9/0061; H03H 9/02047; H03H 9/0207; H03H 9/02551; H03H 9/0538; H03H 9/14567; H03H 9/581; H03H 1/00; H03H 2001/0021; H03H 2003/0421; H03H 2003/0471; H03H 2260/00; H03H 7/0123; H03H 7/07; H03H 7/383; H03H 9/00; H03H 9/02653; H03H 9/02692; H03H 9/02874; H03H 9/02921; H03H 9/0514; H03H 9/08; H03H 9/10; H03H 9/105; H03H 9/135; H03H 9/14579; H03H 9/178; H03H 9/24; H03H 9/585; H03H 9/588; H03H 9/60; H03H 9/6466; H03H 9/6473; H03H 11/02; H03H 11/34; H03H 2003/025; H03H 9/0033; H03H 9/0038; H03H 9/02039; H03H 9/02125; H03H 9/0259; H03H 9/02622; H03H 9/02629; H03H 9/02763; H03H 9/09; H03H 9/125; H03H 9/14505; H03H 9/14597; H03H 9/643; H03H 9/6459
See application file for complete search history.

(56) References Cited

U.S. PATENT DOCUMENTS

| | | | | |
|---|---|---|---|---|
| 2016/0277006 | A1* | 9/2016 | Kaneda | H03H 9/6483 |
| 2017/0077896 | A1* | 3/2017 | Sugaya | H03H 7/38 |
| 2017/0272057 | A1* | 9/2017 | Takata | H03H 9/725 |

* cited by examiner

ACOUSTIC WAVE FILTER, FILTER CIRCUIT, AND RADIO-FREQUENCY MODULE

CROSS REFERENCE TO RELATED APPLICATION

This application claims priority from Japanese Patent Application No. 2024-010257 filed on Jan. 26, 2024. The content of this application is incorporated herein by reference in its entirety.

BACKGROUND ART

The present disclosure relates to an acoustic wave filter, a filter circuit, and a radio-frequency module.

Japanese Unexamined Patent Application Publication No. 2018-088675 discloses a filter module including a bandpass filter and a matching resonator. The passband of the filter is included in the range between the resonant frequency and the anti-resonant frequency of the matching resonator, enabling the impedance in the passband of the filter module to be inductive.

BRIEF SUMMARY

In the filter module disclosed in Japanese Unexamined Patent Application Publication No. 2018-088675, the matching resonator makes the impedance in the passband inductive, achieving a reduction of matching loss in the case of connection with an external circuit having a capacitive impedance. However, the insertion loss of the matching resonator itself may fail to be reduced. Thus, the filter module fails to ensure low loss. Additionally, the matching resonator, which has been added, makes the filter module large.

Accordingly, the present disclosure provides an acoustic wave filter, a filter circuit, and a radio-frequency module which are small and which ensure low loss.

An acoustic wave filter according to an aspect of the present disclosure includes a first serial-arm resonator device disposed on a serial arm path connecting a first input/output terminal and a second input/output terminal, and a first parallel-arm resonator device connected between the serial arm path and a ground. The first serial-arm resonator device includes a first acoustic wave resonator. The first parallel-arm resonator device includes a second acoustic wave resonator and a first inductor which are connected in series between the serial arm path and the ground. The first acoustic wave resonator and the second acoustic wave resonator are formed on an identical piezoelectric substrate. A first resonant frequency is lower than or equal to a low frequency end of a passband of the acoustic wave filter. The first resonant frequency is a resonant frequency of the first parallel-arm resonator device. A first anti-resonant frequency is higher than or equal to a high frequency end of the passband. The first anti-resonant frequency is an anti-resonant frequency of the first parallel-arm resonator device. A frequency difference between the first anti-resonant frequency and the high frequency end of the passband is less than a frequency difference between the first resonant frequency and the low frequency end of the passband.

A filter circuit according to an aspect of the present disclosure includes the acoustic wave filter, a first filter of band-pass type, and a first switch circuit that has a common terminal, a first selection terminal, and a second selection terminal, and that switches between connection between the common terminal and the first selection terminal and connection between the common terminal and the second selection terminal. The acoustic wave filter has the first parallel-arm resonator device and an acoustic-wave filter unit. The first filter has the first parallel-arm resonator device and a first filter unit. The first parallel-arm resonator device is connected to the common terminal. The acoustic-wave filter unit is connected to the first selection terminal. The first filter unit is connected to the second selection terminal. The first resonant frequency is lower than or equal to a low frequency end of a lower frequency side between the low frequency end of the passband of the acoustic wave filter and a low frequency end of a passband of the first filter, and the first anti-resonant frequency is higher than or equal to a high frequency end of a higher frequency side between the high frequency end of the passband of the acoustic wave filter and a high frequency end of the passband of the first filter.

A radio-frequency module according to an aspect of the present disclosure includes the acoustic wave filter and a low-noise amplifier that has an input terminal connected to the first input/output terminal.

The present disclosure may provide an acoustic wave filter, a filter circuit, and a radio-frequency module, which are small and which ensure low loss.

DETAILED DESCRIPTION

Figure 1:
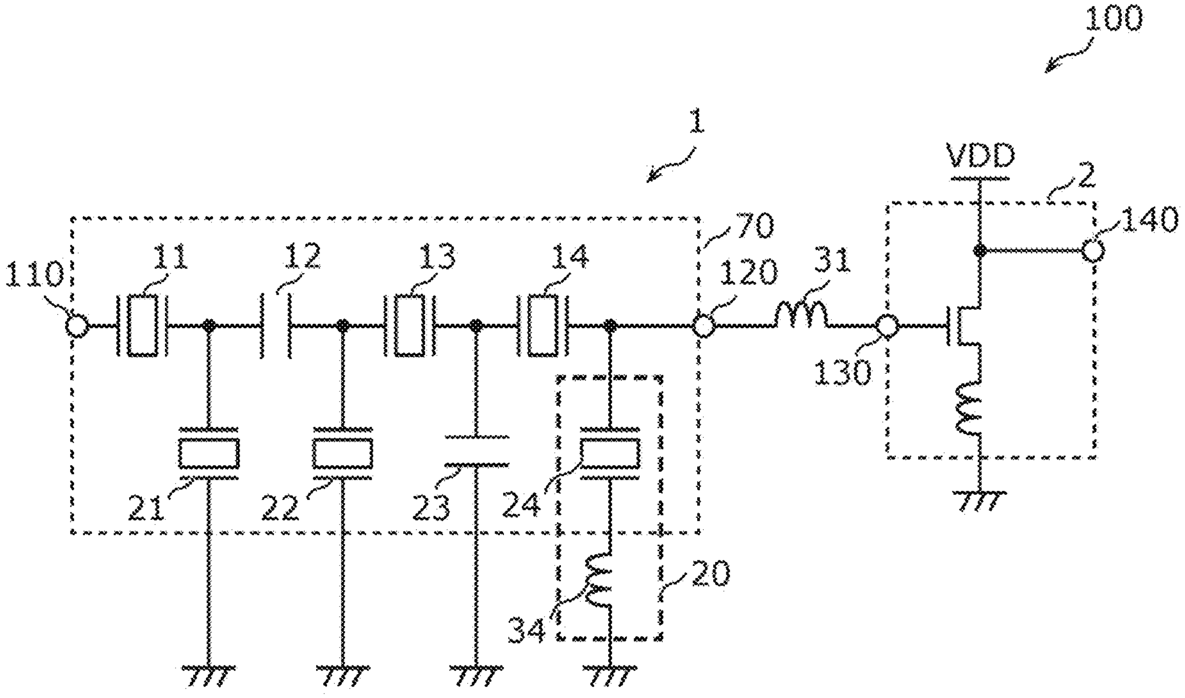
FIG. 1 is a diagram illustrating the circuit configuration of an acoustic wave filter and a radio-frequency module according to an embodiment.

Embodiments of the present disclosure will be described in detail below by using drawings. Each of the embodiments described below indicates a comprehensive or specific example. For example, values, shapes, materials, components, the arrangement and connection form of the components, which are indicated in the embodiments, are exemplary, and are not intended to limit the present disclosure. Among the components in the embodiments below, components that are not described in the independent claims are described as optional components. The size or the size ratio of a component illustrated in drawings is not necessarily strict.

Each figure, which is a schematic view obtained through appropriate highlighting, abbreviation, or adjustment of ratios for describing the present disclosure, is not always illustrated strictly, and may have shapes, positional relationship, and ratios which are different from actual ones. In each figure, substantially the same configurations are designated with the same reference numerals, and repeated description may be skipped or made briefly.

In the circuit configuration in the present disclosure, "to be connected" encompasses, not only direct connection using connection terminals and/or wiring conductors, but also electrical connection through a matching device or a switch circuit. "To be connected between A and B" means connection between A and B and to both A and B.

In the present disclosure, "terminal" means a point where a conductor in a component terminates. When the impedance of a conductor between components is sufficiently low, a terminal is interpreted, not only as a single point, but also as any point (node) on the conductor between the components or as the entire conductor.

In the layout of a circuit device in the present disclosure, "circuit device A is disposed in series to path B" means that the signal input end and the signal output end of circuit device A are connected to the respective two wiring lines which form at least a part of path B. At least one of the two wiring lines may be an electrode or a terminal.

In each figure described below, x axis and y axis are orthogonal to each other in a plane parallel to a principal surface of a module substrate. Specifically, when a module substrate is rectangular in plan view, x axis is parallel to a first side of the module substrate, and y axis is parallel to a second side orthogonal to the first side of the module substrate. Z axis is an axis perpendicular to the principal surface of the module substrate. The positive direction of z axis goes upward; the negative direction goes downward.

Terms which indicate relationship between components, such as "parallel" and "perpendicular", terms which indicate the shapes of components, such as "rectangular", and numerical ranges do not represent only strict meaning, and mean substantially equivalent ranges, for example, having errors in the order of a few percent.

In a component layout in the present disclosure, "plan view of a module substrate" means viewing an object subjected to orthogonal projection to the xy plane from the z-axis positive side. "In plan view, A overlaps B" means that at least part of the area of A subjected to orthogonal projection to the xy plane overlaps at least part of the area of B subjected to orthogonal projection to the xy plane. "A is disposed between B and C" means that at least one of line segments connecting any points in B to any points in C passes through A.

In a component layout in the present disclosure, "to dispose a component on/in a substrate" encompasses placement of the component on a principal surface of the substrate and placement of the component in the substrate. "To dispose a component on a principal surface of a substrate" encompasses, in addition to placement of the component which is in contact with the principal surface of the substrate, placement of the component above the principal surface without necessarily contact with the principal surface (for example, stacking the component on a different component which is disposed so as to be in contact with the principal surface). "To dispose a component on a principal surface of a substrate" may encompass placement of the component in a recess formed on the principal surface. "To dispose a component in a substrate" encompasses, in addition to the component encapsulated in the module substrate, the component, all of which is disposed between the principal surfaces of the substrate but a part of which is not covered by the substrate, and the component, only a part of which is disposed in the substrate.

In the embodiments below, the passband of a filter is defined as a frequency band between two frequencies, each of which has an insertion loss larger by 3 dB than the minimum of the insertion loss in the passband.

An acoustic-wave resonator device is defined as either one of the following: (1) a resonant circuit including an acoustic wave resonator and a circuit (or a circuit device) which is connected in parallel to the acoustic wave resonator (a parallel connection circuit of an acoustic wave resonator and a circuit (or a circuit device)); (2) a resonant circuit which includes an acoustic wave resonator and a circuit (or a circuit device) connected only to one of the two input/output ends of the acoustic wave resonator and which has a configuration in which the connection node, at which the acoustic wave resonator is connected to the circuit (or the circuit device), is connected neither to a different circuit (and a different circuit device) nor to the ground (a serial connection circuit of an acoustic wave resonator and a circuit (or a circuit device)); (3) a resonant circuit including multiple acoustic wave resonators connected in parallel to each other (a parallel connection circuit of divided resonators); (4) a resonant circuit which includes multiple acoustic wave resonators connected in series to each other and which has a configuration in which the connection nodes, which connect between the acoustic wave resonators, are connected neither to circuits (and circuit devices) other than the acoustic wave resonators nor to the ground (a serial connection circuit of divided resonators).

In the embodiments in the present disclosure, a resonant bandwidth means a frequency difference between the anti-resonant frequency and the resonant frequency of an acoustic wave resonator.

A resonant frequency and an anti-resonant frequency described in the embodiments and the modified examples are derived in such a manner that, for example, in the state in which an acoustic wave resonator or an acoustic-wave resonator device is not connected to a different circuit device, the two input/output electrodes of the acoustic wave resonator or the acoustic-wave resonator device are in contact with a radio frequency (RF) probe, and a network analyzer or the like is used to measure the reflection characteristics (impedance characteristics).

In the present disclosure, "band" means either one or both of the uplink operating band and the downlink operating band of a frequency band predefined, for example, by a standardization organization (for example, 3GPP® or IEEE (Institute of Electrical and Electronics Engineers)) for a communication system constructed by using radio access technology (RAT). In the present embodiment, a communication system may be, for example, but not limited to, a Long Term Evolution (LTE) system, a 5th Generation (5G)-New Radio (NR) system, or a wireless local area network (WLAN) system. The uplink operating band of a frequency band means the frequency range specified for uplink in the frequency band. The downlink operating band of a frequency band means a frequency range specified for downlink in the frequency band.

Embodiment

1 the Circuit Configuration of an Acoustic Wave Filter 1 and a Radio-Frequency Module 100

FIG. 1 is a diagram illustrating the circuit configuration of an acoustic wave filter 1 and a radio-frequency module 100 according to an embodiment. As illustrated in FIG. 1, the radio-frequency module 100 includes the acoustic wave filter 1, a low-noise amplifier 2, and an inductor 31.

The low-noise amplifier 2 is connected to the acoustic wave filter 1 through the inductor 31. Specifically, the low-noise amplifier 2 is connected, at its input terminal 130, to an input/output terminal 120 of the acoustic wave filter 1 through the inductor 31. The low-noise amplifier 2 includes an amplifier transistor which is, for example, a field effect transistor (FET) or a bipolar transistor. The gate (or the base), which is the input end of the amplifier transistor, is connected to the input/output terminal 120 through the inductor 31; the drain (or the collector) is connected to an output terminal 140; the source (or the emitter) is connected to the ground through an inductor. The gate (or the base) of the amplifier transistor is supplied with a direct-current bias voltage (direct-current bias current). In the configuration described above, the low-noise amplifier 2 is supplied, at its gate (or its base), with the direct-current bias voltage (direct-current bias current). Thus, a radio frequency signal, which has passed through the acoustic wave filter 1, is amplified for output to the output terminal 140. The low-noise amplifier 2 has a capacitive, high input impedance.

The inductor 31, which is connected, at its first end, to the input/output terminal 120 of the acoustic wave filter 1 and is connected, at its second end, to the input terminal 130 of the low-noise amplifier 2, is a circuit device for impedance matching between the acoustic wave filter 1 and the low-noise amplifier 2. The inductor 31 is optional component in the radio-frequency module 100 according to the present embodiment.

The acoustic wave filter 1, which is a bandpass filter, includes serial arm resonators 11, 12, 13, and 14, parallel arm resonators 21, 22, 23, and 24, an inductor 34, and input/output terminals 110 and 120.

Each of the serial arm resonators 11 to 14 is an acoustic-wave resonator device including an acoustic wave resonator, and is disposed on a serial arm path connecting the input/output terminal 110 (second input/output terminal) to the input/output terminal 120 (first input/output terminal). The serial arm resonator 11 alone constitutes a single serial-arm resonator device (acoustic-wave resonator device); the serial arm resonator 12 alone constitutes a single serial-arm resonator device (acoustic-wave resonator device); the serial arm resonator 13 alone constitutes a single serial-arm resonator device (acoustic-wave resonator device). Each of the serial arm resonators 11 to 14 is an exemplary first acoustic wave resonator, and is an exemplary first serial-arm resonator device.

The serial arm resonators 11 to 14 are connected to each other in the order of the serial arm resonators 11, 12, 13, and 14 from the input/output terminal 110.

Each of the parallel arm resonators 21 to 23 is an acoustic-wave resonator device including an acoustic wave resonator, and is connected between the serial arm path and the ground. The parallel arm resonator 21 is connected between the ground and the connection point between the serial arm resonators 11 and 12. The parallel arm resonator 22 is connected between the ground and the connection point between the serial arm resonators 12 and 13. The parallel arm resonator 23 is connected between the ground and the connection point between the serial arm resonators 13 and 14. The parallel arm resonator 21 alone constitutes a single parallel-arm resonator device (acoustic-wave resonator device); the parallel arm resonator 22 alone constitutes a single parallel-arm resonator device (acoustic-wave resonator device); the parallel arm resonator 23 alone constitutes a single parallel-arm resonator device (acoustic-wave resonator device).

The parallel arm resonator 24 and the inductor 34, which are connected in series to each other, constitute an acoustic-wave resonator device including an acoustic wave resonator, and form a parallel-arm resonator device 20. The parallel-arm resonator device 20 is connected between the ground and the connection point between the serial arm resonator 14 and the input/output terminal 120. More specifically, the parallel arm resonator 24 is connected to the serial arm path connecting the input/output terminals 110 and 120, and the inductor 34 is connected to the ground. The parallel arm resonator 24 is an exemplary second acoustic wave resonator; the inductor 34 is an exemplary first inductor; the parallel-arm resonator device 20 is an exemplary first parallel-arm resonator device.

The parallel-arm resonator device 20 has a resonant frequency frp20 (first resonant frequency) and an anti-resonant frequency fap20 (first anti-resonant frequency). The parallel arm resonator 24 has a resonant frequency frp24 and an anti-resonant frequency fap24. Serial connection of the inductor 34 to the parallel arm resonator 24 causes the resonant frequency frp20 of the parallel-arm resonator device 20 to shift to the low frequency side of the resonant frequency frp24 of the parallel arm resonator 24. That is, serial connection of the inductor 34 to the parallel arm resonator 24 causes the resonant bandwidth (fap20-frp20) of the parallel-arm resonator device 20 to be broader than the resonant bandwidth (fap24-frp24) of the parallel arm resonator 24.

The serial arm resonators 11 to 14 and the parallel arm resonators 21 to 24 are formed on the same piezoelectric substrate 70. This achieves a reduction in size of the acoustic wave filter 1. Not all the acoustic wave resonators included in the acoustic wave filter 1 are necessarily formed on the same piezoelectric substrate 70. The parallel arm resonator 24 and at least one of the serial arm resonators 11 to 14 may be formed on the same piezoelectric substrate 70. This achieves a reduction in size of the acoustic wave filter 1 compared with the case in which the acoustic wave resonators are formed on different piezoelectric substrates.

Each of the serial arm resonators 11 to 14 and the parallel arm resonators 21 to 23 (acoustic-wave resonator devices) has only a single acoustic wave resonator. Alternatively, each of the serial arm resonators 11 to 14 and the parallel arm resonators 21 to 23 may be one of the following: for example, (1) a resonator device including an acoustic wave resonator and a circuit that includes either one or both of a capacitor and an inductor which are connected in parallel to the acoustic wave resonator; (2) a resonator device including an acoustic wave resonator and a circuit that includes either one or both of a capacitor and an inductor which are connected in series to the acoustic wave resonator; (3) a resonator device including multiple acoustic wave resonators connected in parallel to each other; (4) a resonator device including multiple acoustic wave resonators connected in series to each other.

The acoustic wave filter 1 according to the present embodiment may have any configuration as long as it includes the parallel-arm resonator device 20 and at least one of the serial arm resonators 11 to 14. The other acoustic wave resonators are optional. The acoustic wave filter 1 according to the present embodiment may include, in addition to the serial-arm resonator devices and the parallel-arm resonator devices forming a ladder filter, at least one of the following devices: a longitudinally coupled resonator-type resonator device; a capacitor; and an inductor.

2 The Structure of an Acoustic Wave Resonator

The structure of the acoustic wave resonators (the serial arm resonators and the parallel arm resonators) included in the acoustic wave filter 1 will be described by taking examples.

Figure 2A:
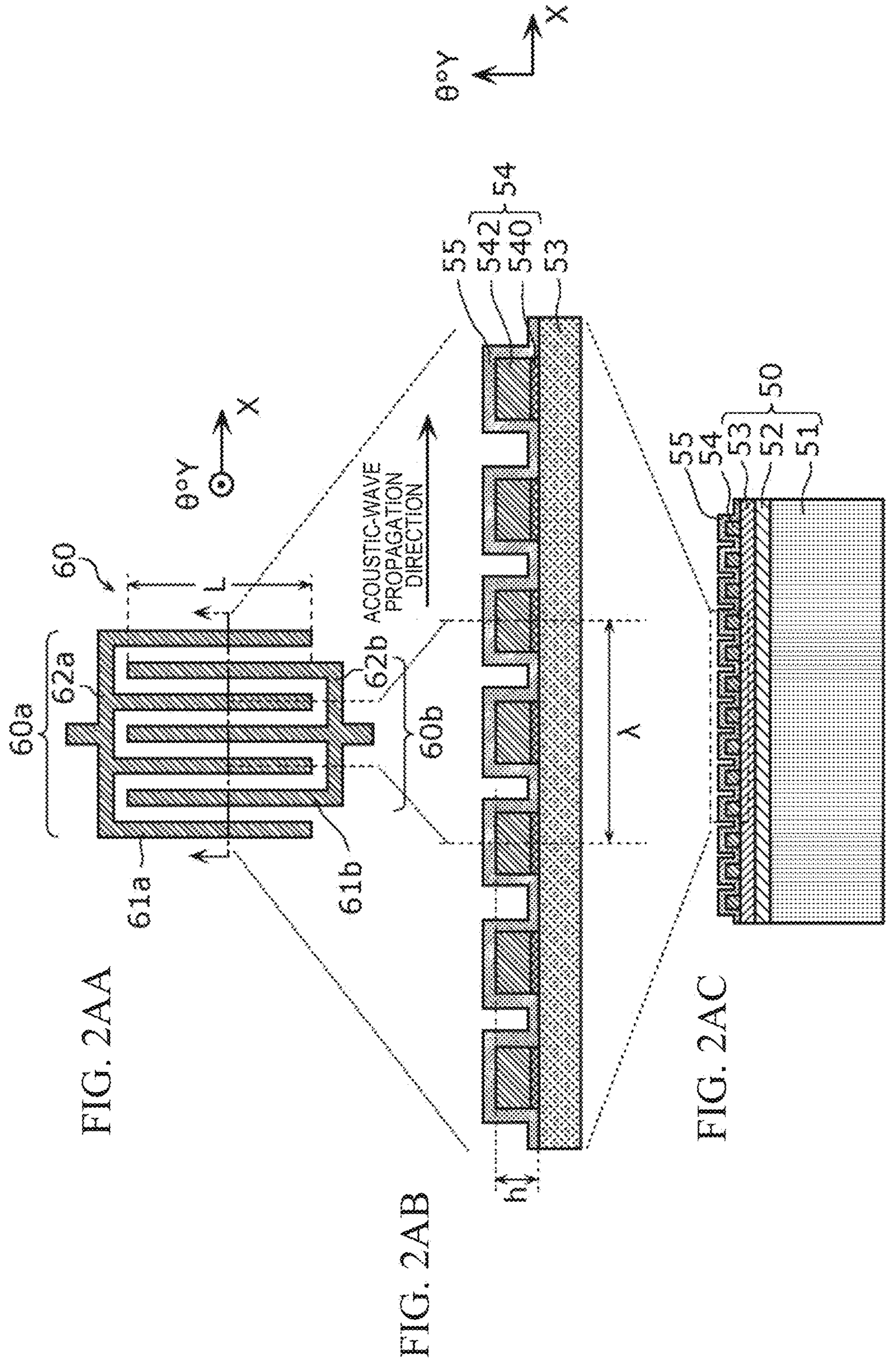
FIGS. 2AA-2AC illustrate schematic plan and cross-sectional views of a first example of an acoustic wave resonator included in an acoustic wave filter according to an embodiment.

FIGS. 2AA-2AC illustrate schematic plan and cross-sectional views of a first example of an acoustic wave resonator included in the acoustic wave filter 1 according to the embodiment. FIGS. 2AA-2AC illustrate a basic structure of each of the acoustic wave resonators included in the acoustic wave filter 1. An acoustic wave resonator 60 illustrated in FIGS. 2AA-2AC are used for description about the typical structure of a surface acoustic wave resonator included in the acoustic wave filter 1. The number of electrode fingers forming an electrode, the length of each electrode finger, and the like are not limited to the illustrated ones.

The acoustic wave resonator 60 includes a piezoelectric substrate 50 and comb electrodes 60_a_ and 60_b_.

As illustrated in FIG. 2AA, the pair of comb electrodes 60_a_ and 60_b_, which are opposite each other, are formed on the piezoelectric substrate 50. The comb electrode 60_a_ is constituted by multiple electrode fingers 61_a_, which are parallel to each other, and a busbar electrode 62_a_, which connects the electrode fingers 61_a_ to each other. The comb electrode 60_b_ is constituted by multiple electrode fingers 61_b_, which are parallel to each other, and a busbar electrode 62_b_, which connects the electrode fingers 61_b_ to each other. The multiple electrode fingers 61_a_ and 61_b_ are formed in the direction orthogonal to the acoustic-wave propagation direction (X-axis direction).

The multiple electrode fingers 61_a_ and 61_b_ and the busbar electrodes 62_a_ and 62_b_ constitute an interdigital transducer (IDT) electrode 54 which has a multilayer structure of an adhesive layer 540 and a main electrode layer 542 as illustrated in FIG. 2AB.

The adhesive layer 540 is a layer for enhancing the adhesiveness between the piezoelectric substrate 50 and the main electrode layer 542. The material of the adhesive layer 540 is, for example, Ti. The material of the main electrode layer 542 is, for example, Al containing 1% of Cu. A protective layer 55 is formed so as to cover the comb electrodes 60_a_ and 60_b_. The protective layer 55 is a layer, for example, for protection of the main electrode layer 542 from the external environment, adjustment of the frequency temperature characteristics, and enhancement of the moisture resistance, and is, for example, a dielectric film whose main component is silicon dioxide.

The materials of the adhesive layer 540, the main electrode layer 542, and the protective layer 55 are not necessarily limited to those described above. The IDT electrode 54 does not necessarily have the multilayer structure described above. The IDT electrode 54 may be formed, for example, of a metal, such as Ti, Al, Cu, Pt, Au, Ag, or Pd, or an alloy, or may be constituted by multiple multilayer bodies formed of the above-described metals or the alloy. The protective layer 55 is not necessarily formed.

The multilayer structure of the piezoelectric substrate 50 will be described.

As illustrated in FIG. 2AC, the piezoelectric substrate 50 includes a high-acoustic-velocity supporting substrate 51, a low-acoustic-velocity film 52, and a piezoelectric film 53, and has a structure in which the high-acoustic-velocity supporting substrate 51, the low-acoustic-velocity film 52, and the piezoelectric film 53 are laminated in this sequence. The piezoelectric substrate 50 is an exemplary piezoelectric substrate 70 of the acoustic wave filter 1.

The piezoelectric film 53 is formed, for example, of θ° Y-cut X-propagation $LiTaO_3$ piezoelectric single crystal or piezoelectric ceramic (lithium tantalate single crystal, which is cut on a plane whose normal is the axis rotated by θ° from the Y axis by using the X axis as the central axis, or ceramic; in the single crystal or the ceramic, surface acoustic waves propagate in the X-axis direction). In accordance with the requirement specification of each filter, the material and the cut angle θ of the piezoelectric single crystal, which is used as the piezoelectric film 53, are appropriately selected.

The high-acoustic-velocity supporting substrate 51 supports the low-acoustic-velocity film 52, the piezoelectric film 53, and the IDT electrode 54. The high-acoustic-velocity supporting substrate 51 is a substrate in which the acoustic velocity of bulk waves is higher than that of acoustic waves, such as surface acoustic waves and boundary waves, propagating in the piezoelectric film 53. The high-acoustic-velocity supporting substrate 51 functions so that surface acoustic waves are confined in a multilayer portion of the piezoelectric film 53 and the low-acoustic-velocity film 52 not to leak downward from the high-acoustic-velocity supporting substrate 51. Examples of the material of the high-acoustic-velocity supporting substrate 51 include a piezoelectric material, such as aluminum nitride, lithium tantalate, lithium niobate, or crystal, a ceramic, such as alumina, sapphire, magnesia, silicon nitride, silicon carbide, zirconia, cordierite, mullite, steatite, forsterite, spinel, or sialon, a dielectric material, such as aluminum oxide, silicon oxynitride, diamond-like carbon (DLC), or diamond, a semiconductor such as silicon, and a material whose main component is a material described above. The spinel contains an aluminum compound comprising oxygen and one or more elements selected, for example, from Mg, Fe, Zn, and Mn. Examples of the spinel may include $MgAl_2O_4$, $FeAl_2O_4$, $ZnAl_2O_4$, and $MnAl_2O_4$.

The low-acoustic-velocity film 52 is a film in which the acoustic velocity of bulk waves is lower than that of bulk waves propagating through the piezoelectric film 53. The low-acoustic-velocity film 52 is disposed between the piezoelectric film 53 and the high-acoustic-velocity supporting substrate 51. This structure and the property that energy of acoustic waves concentrates on a medium having a low acoustic velocity suppress a leak of energy of surface acoustic waves to the outside of the piezoelectric film 53. Examples of the material of the low-acoustic-velocity film 52 may include glass, silicon oxide, silicon oxynitride, lithium oxide, tantalum oxide, a dielectric material such as a compound of silicon oxide plus fluorine, carbon, or boron, and a material whose main component is a material described above.

The multilayer structure of the piezoelectric substrate 50 enables the Q values at the resonant frequency and the anti-resonant frequency to be increased substantially compared with a structure of the related art in which a piezoelectric substrate as a single layer is used. That is, an acoustic wave resonator having a high Q value may be formed. Thus, the acoustic wave resonator may be used to form a filter having a low insertion loss.

The high-acoustic-velocity supporting substrate 51 may have a multilayer structure of a supporting substrate and a high-acoustic-velocity film through which the acoustic velocity of bulk waves propagating is higher than that of acoustic waves, such as surface acoustic waves and boundary waves, propagating through the piezoelectric film 53. In this case, the material of the high-acoustic-velocity film may be the same material as that of the high-acoustic-velocity supporting substrate 51. Examples of the material of the supporting substrate may include a piezoelectric material, such as aluminum nitride, lithium tantalate, lithium niobate, or crystal, a ceramic, such as alumina, sapphire, magnesia, silicon nitride, silicon carbide, zirconia, cordierite, mullite, steatite, or forsterite, a dielectric material, such as diamond or glass, a semiconductor, such as silicon or gallium nitride, a resin, and a material whose main component is a material described above.

In the specification, "the main component of a material" refers to a component whose ratio in the material exceeds 50% by weight. The main component may be present in any of the monocrystalline state, the polycrystalline state, and the amorphous state, or in a mixed state of these.

Figure 2B:
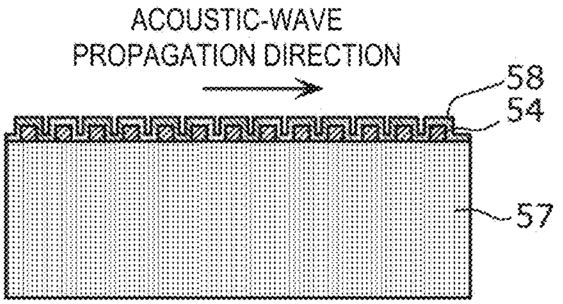
FIG. 2B is a schematic cross-sectional view of a second example of an acoustic wave resonator included in an acoustic wave filter according to an embodiment.

FIG. 2B is a schematic cross-sectional view of a second example of an acoustic wave resonator included in the acoustic wave filter 1 according to the embodiment. In the acoustic wave resonator 60 illustrated in FIGS. 2AA-2AC, the example in which the IDT electrode 54 is formed on the piezoelectric substrate 50 having the piezoelectric film 53 is illustrated. As illustrated in FIG. 2B, a substrate on which the IDT electrode 54 is formed may be a piezoelectric single-crystal substrate 57 having a single-layered piezoelectric material layer.

The piezoelectric single-crystal substrate 57 is formed, for example, of $LiNbO_3$ piezoelectric single crystal. The acoustic wave resonator according to the example includes the $LiNbO_3$ piezoelectric single-crystal substrate 57, the IDT electrode 54, and a protective layer 58 formed on the piezoelectric single-crystal substrate 57 and the IDT electrode 54. The piezoelectric single-crystal substrate 57 is an exemplary piezoelectric substrate 70 of the acoustic wave filter 1.

The multilayer structure, the material, the cut angle, and the thickness of each of the piezoelectric film 53 and the piezoelectric single-crystal substrate 57, which are described above, may be appropriately changed in accordance with required bandpass characteristics or the like of the acoustic wave filter. Even an acoustic wave resonator, for example, using a $LiTaO_3$ piezoelectric substrate having a cut angle other than the above-described cut angle may exert substantially the same effects as those of the acoustic wave resonator 60 using the piezoelectric film 53.

A substrate on which the IDT electrode 54 is formed may have a multilayer structure of a supporting substrate, an energy confinement layer, and a piezoelectric film, which are laminated in this sequence. The IDT electrode 54 is formed on the piezoelectric film. The piezoelectric film is, for example, a $LiTaO_3$ piezoelectric single crystal or a piezoelectric ceramic. The supporting substrate supports the piezoelectric film, the energy confinement layer, and the IDT electrode 54.

The energy confinement layer is constituted by one or more layers. The velocity of bulk acoustic waves propagating through at least one of the layers is higher than that of acoustic waves propagating through the piezoelectric film and its vicinity. For example, the energy confinement layer may have a multilayer structure of a low-acoustic-velocity layer and a high-acoustic-velocity layer. The low-acoustic-velocity layer is a film in which the acoustic velocity of bulk waves in the low-acoustic-velocity layer is lower than that of acoustic waves propagating through the piezoelectric film. The high-acoustic-velocity layer is a film in which the acoustic velocity of bulk waves in the high-acoustic-velocity layer is higher than that of acoustic waves propagating through the piezoelectric film. The high-acoustic-velocity layer may be used as the supporting substrate.

The energy confinement layer may be an acoustic impedance layer having a configuration in which low-acoustic-impedance layers having a relatively low acoustic impedance and high-acoustic-impedance layers having a relatively high acoustic impedance are laminated alternately.

Electrode parameters of the IDT electrode 54 included in the acoustic wave resonator 60 will be described.

The wavelength of an acoustic wave resonator is defined by the wavelength λ which is a repeating period of the electrode fingers 61*a* or 61*b* included in the IDT electrode 54 illustrated in FIG. 2AB. The electrode-finger pitch, which is half the wavelength λ, is defined as (W+S), where the line width of each of the electrode fingers 61*a* and 61*b* included in the comb electrodes 60*a* and 60*b*, respectively, is represented by W, and the space width between each adjacent pair of an electrode finger 61*a* and an electrode finger 61*b* is represented by S. The duty of the IDT electrode 54, which is a line-width occupancy ratio of the electrode fingers 61*a* and 61*b*, is defined as W/(W+S) which is a ratio of the line width with respect to the sum of the line width and the space width of each of the electrode fingers 61*a* and 61*b*. The intersecting width of the IDT electrode 54 is the length of the overlapping portion of the electrode fingers 61*a* and the electrode fingers 61*b* which is obtained when the electrode fingers are viewed in the acoustic-wave propagation direction (X-axis direction).

When intervals between adjacent electrode fingers are not constant in the IDT electrode 54, the electrode-finger pitch of the IDT electrode 54 is defined as the average electrode-finger pitch of the IDT electrode 54. The average electrode-finger pitch of the IDT electrode 54 is defined as Di/(Ni−1) where the total number of the electrode fingers 61*a* and 61*b* included in the IDT electrode 54 is represented by Ni, and the center-to-center distance between the electrode finger, which is located at an end in the acoustic-wave propagation direction, and the electrode finger, which is located at the other end, in the IDT electrode 54 is represented by Di.

Figure 2C:
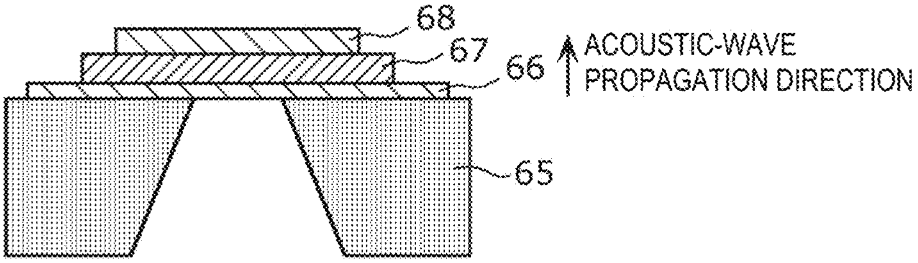
FIG. 2C is a schematic cross-sectional view of a third example of an acoustic wave resonator included in an acoustic wave filter according to an embodiment.

FIG. 2C is a schematic cross-sectional view of a third example of an acoustic wave resonator included in the acoustic wave filter 1 according to the embodiment. FIG. 2C illustrates a bulk acoustic wave resonator as an acoustic wave resonator of the acoustic wave filter 1. As illustrated in FIG. 2C, for example, the bulk acoustic wave resonator, which has a supporting substrate 65, a lower electrode 66, a piezoelectric material layer 67, and an upper electrode 68, has a configuration in which the supporting substrate 65, the lower electrode 66, the piezoelectric material layer 67, and the upper electrode 68 are laminated in this sequence.

The supporting substrate 65 is a substrate for supporting the lower electrode 66, the piezoelectric material layer 67, and the upper electrode 68, and is, for example, a silicon substrate. The supporting substrate 65 has a hollow in a contact area with the lower electrode 66. This enables the piezoelectric material layer 67 to vibrate freely. The supporting substrate 65 is an exemplary piezoelectric substrate 70 of the acoustic wave filter 1.

The lower electrode 66 is formed on a first surface of the supporting substrate 65. The upper electrode 68 is formed on the first surface of the supporting substrate 65. The material of the lower electrode 66 and the upper electrode 68 is, for example, Al containing 1% of Cu.

The piezoelectric material layer 67 is formed between the lower electrode 66 and the upper electrode 68. The piezoelectric material layer 67 has a main component, for example, of at least one of the elements: ZnO (zinc oxide); AlN (aluminum nitride); PZT (lead zirconate titanate); KN (potassium niobate); LN (lithium niobate); LT (lithium tantalate); crystal; and LiBO (lithium borate).

The bulk acoustic wave resonator having the multilayer structure generates resonance through inducement, which is caused by application of electrical energy between the lower electrode 66 and the upper electrode 68, of bulk acoustic waves in the piezoelectric material layer 67. Bulk acoustic waves generated by the bulk acoustic wave resonator propagate between the lower electrode 66 and the upper electrode 68 in the direction perpendicular to the film surface of the piezoelectric material layer 67. That is, the bulk acoustic wave resonator is a resonator using bulk acoustic waves.

3 The Resonance Characteristics and Bandpass Characteristics of the Acoustic Wave Filter 1

A basic operating principle of a ladder bandpass filter including a single serial arm resonator and a single parallel arm resonator will be described.

The parallel arm resonator has a resonant frequency frp and an anti-resonant frequency fap (fap>frp); the serial arm resonator has a resonant frequency frs and an anti-resonant frequency fas (fas>frs>frp). In the serial arm resonator and the parallel arm resonator having the resonance characteristics described above, the anti-resonant frequency fap of the parallel arm resonator is typically made close to the resonant frequency frs of the serial arm resonator. Thus, a range around the resonant frequency frp, in which the impedance of the parallel arm resonator approaches zero, serves as the zone of inhibition on the low frequency side. When the frequency further increases, the impedance of the parallel arm resonator is made high in a range around the anti-resonant frequency fap, and the impedance of the serial arm resonator approaches zero in a range around the resonant frequency frs. Thus, the range, including its neighboring vicinity, between the anti-resonant frequency fap and the resonant frequency frs serves as the signal passband on a signal path which is the serial arm path. This enables the passband, which reflects the electrode parameters and the electromechanical coupling coefficient of the acoustic wave resonators, to be formed. When the frequency further increases to a frequency in a range around the anti-resonant frequency fas, the impedance of the serial arm resonator is made high, serving as the zone of inhibition on the high frequency side.

Each of the serial arm resonator and the parallel arm resonator has a capacitive (C property) impedance in the frequency band on the low frequency side of the resonant frequency; has an inductive (L property) impedance in the frequency band which is higher than the resonant frequency and lower than the anti-resonant frequency; and has a capacitive impedance in the frequency band of the high frequency side of the anti-resonant frequency.

When the resonant bandwidth is broader than a desired passband width, the anti-resonant frequency of the parallel arm resonator may be higher than the high range end of the passband, and the resonant frequency of the serial arm resonator may be lower than the low range end of the passband. A resonator having a resonance band, which is a frequency range from the resonant frequency to the anti-resonant frequency and at least a part of which overlaps the passband of the acoustic wave filter 1, is defined as a resonator which contributes formation of the passband of the acoustic wave filter 1.

The impedance characteristics and the bandpass characteristics of the acoustic wave filter 1 will be described.

Figure 3A:
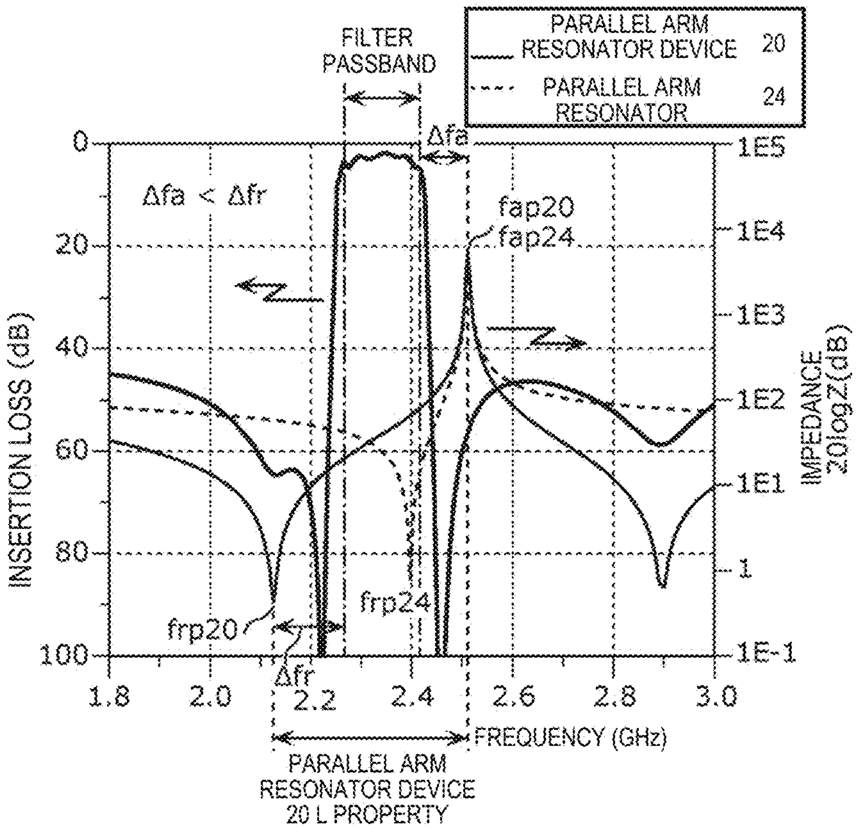
FIG. 3A is a graph illustrating the bandpass characteristics in the passband of an acoustic wave filter and its vicinity, and illustrating the impedance characteristics of a first parallel-arm resonator device, according to an embodiment.
Figure 3B:
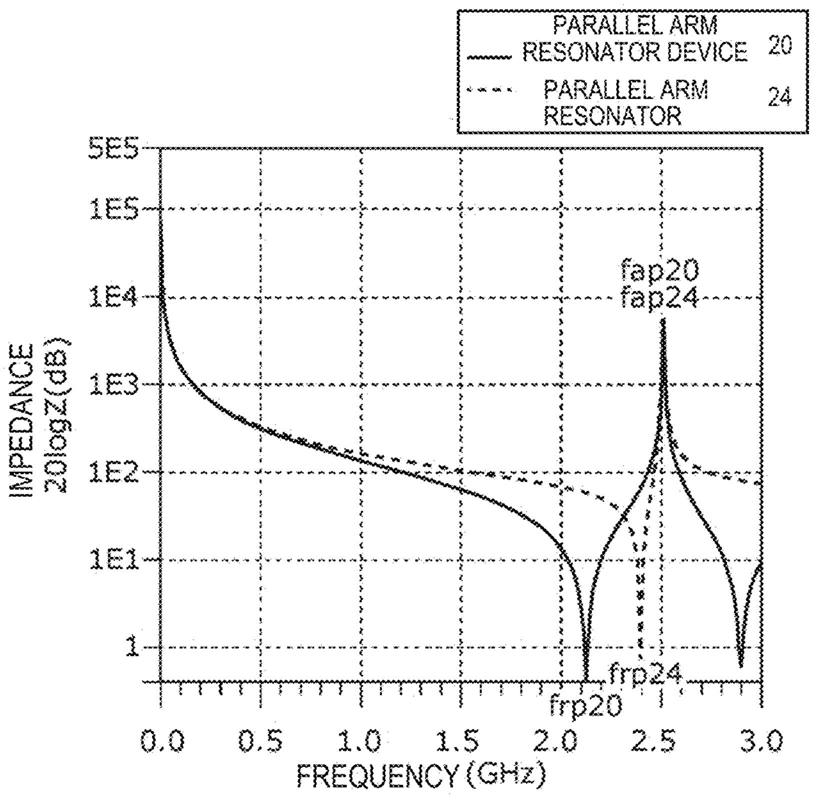
FIG. 3B is a graph illustrating the impedance characteristics, in a broad range, of a first parallel-arm resonator device of an acoustic wave filter according to an embodiment.

FIG. 3A is a graph illustrating the bandpass characteristics of the passband of the acoustic wave filter 1 and its vicinity, and illustrating the impedance characteristics of the parallel-arm resonator device 20, according to the embodiment. FIG. 3B is a graph illustrating the impedance characteristics, in a broad range, of the parallel-arm resonator device 20 according to the embodiment.

As illustrated in FIG. 3A, the resonant frequency frp24 of the parallel arm resonator 24 is positioned in the passband. In contrast, the resonant frequency frp20 of the parallel-arm resonator device 20 is lower than or equal to the low frequency end of the passband of the acoustic wave filter 1, and the anti-resonant frequency fap20 of the parallel-arm resonator device 20 is higher than or equal to the high frequency end of the passband. The frequency difference Δfa between the anti-resonant frequency fap20 and the high frequency end of the passband is less than the frequency difference Δfr between the resonant frequency frp20 and the low frequency end of the passband.

At least one of the resonant frequencies of the serial arm resonators 11 to 14 is positioned in the passband, and at least one of the anti-resonant frequencies of the parallel arm resonators 21 to 23 is positioned in the passband (not illustrated in FIG. 3A). This achieves a reduction of the insertion loss of the ladder acoustic wave filter 1.

In a ladder acoustic wave filter, positioning, in the passband, the resonant frequency of a serial-arm resonator device and the anti-resonant frequency of a parallel-arm resonator device achieves low-loss, steep bandpass characteristics. Therefore, in the passband, the impedance of the acoustic wave filter tends to be at least capacitive. Thus, when a capacitive circuit, whose input impedance is capacitive, such as the low-noise amplifier 2 is connected to the acoustic wave filter, placement of an inductive matching circuit between the capacitive circuit and the acoustic wave filter enables matching between the two devices at a reference impedance.

In contrast, in the configuration of the acoustic wave filter 1 according to the present embodiment, either one or both of the resonant frequency frp24 and the anti-resonant frequency fap24 of the parallel arm resonator 24 formed on the piezoelectric substrate 70, on which the serial arm resonators 11 to 14 and the parallel arm resonators 21 to 23 which form the passband are formed, are highly likely to be positioned in the passband. However, the inductor 34 is connected in series to the parallel arm resonator 24. Thus, the resonant bandwidth of the parallel-arm resonator device 20 is extended for adjustment so that the passband is positioned between the resonant frequency frp20 and the anti-resonant frequency fap20 of the parallel-arm resonator device 20. Thus, the impedance, in the passband, of the parallel-arm resonator device 20 is inductive. Without necessarily placement of an inductive matching circuit between the capacitive circuit and the acoustic wave filter 1, it is possible to match the impedance between the capacitive circuit and the acoustic wave filter 1. In addition, the anti-resonant frequency fap20 having a high impedance is positioned closer to the passband than the resonant frequency frp20 having a low impedance is. Thus, signals in the passband may be transmitted from the input/output terminal 110 to the input/output terminal 120 with low loss. Further, as illustrated in FIG. 3B, the parallel-arm resonator device 20 has a high impedance in the direct current (DC) region. Thus, the direct-current bias voltage (direct-current bias current), which is supplied to the low-noise amplifier 2, may be prevented from leaking to the acoustic wave filter 1 side, eliminating the necessity of a capacitor for DC cut which is disposed in series on a path connecting the acoustic wave filter 1 to the input end of the amplifier transistor of the low-noise amplifier 2. Therefore, the small, low-loss acoustic wave filter 1, in which both the matching loss and the insertion loss are reduced, may be provided.

Figures 4A, 4B, 4C:
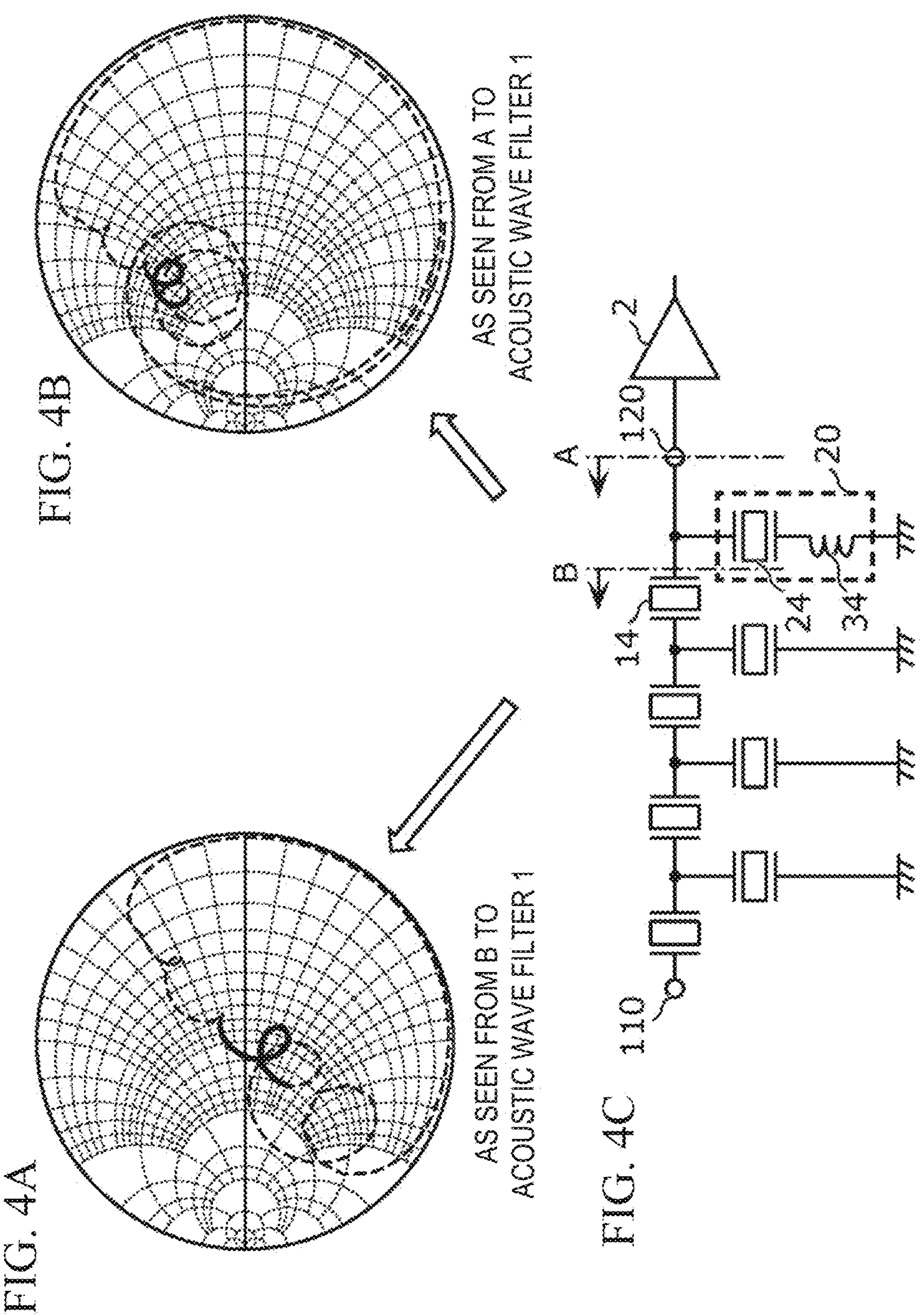
FIGS. 4A and 4B illustrate admittance charts showing the impedance characteristics of an acoustic wave filter according to an embodiment as shown in FIG. 4C.

FIGS. 4A and 4B include admittance charts of the impedance characteristics of the acoustic wave filter 1 according to the embodiment as shown in FIG. 4C. As illustrated in FIG. 4A, the impedance of the passband (the bold, solid line in FIG. 4A), as seen from node B (the connection node between the serial arm resonator 14 and the parallel-arm resonator device 20) to the input/output terminal 110 side, is positioned near the reference impedance. That is, the impedance of an acoustic wave filter, to which the parallel-arm resonator device 20 is not added, is positioned near the reference impedance. In the state in which the parallel-arm resonator device 20 is not added, when the low-noise amplifier 2 having a capacitive input impedance is connected to the input/output terminal 120, the impedance of the radio-frequency module including the acoustic wave filter and the low-noise amplifier 2 deviates from the reference impedance.

In contrast, as illustrated in FIG. 4B, the impedance of the passband (the bold, solid line in FIG. 4B), as seen from node A (the input/output terminal 120) to the input/output terminal 110 side, is moved in the counterclockwise direction along an equal conductance circle because of addition of the inductive impedance of the parallel-arm resonator device 20 to the impedance at node B, resulting in being inductive and low.

This enables the impedance of the radio-frequency module 100 having the configuration, in which the acoustic wave filter 1 having an inductive impedance is connected to the low-noise amplifier 2 having a capacitive impedance, to be close to the reference impedance. Therefore, the matching loss of the acoustic wave filter 1 and the radio-frequency module 100 may be reduced.

In the acoustic wave filter 1 according to the present embodiment, the first parallel-arm resonator device (parallel-arm resonator device 20) among the multiple parallel-arm resonator devices is connected closest to the input/output terminal 120.

Thus, the resonator device, which has an inductive impedance in the passband, is disposed closest to the input terminal 130 of the low-noise amplifier 2 having a capacitive impedance, enabling impedance matching between the acoustic wave filter 1 and the low-noise amplifier 2 to be made with high efficiency and high accuracy.

The first parallel-arm resonator device is not necessarily connected closest to the input/output terminal 120 among the parallel-arm resonator devices, and may be connected to a node on the serial arm path from the input/output terminal 110 to the serial arm resonator 14.

Figure 5:
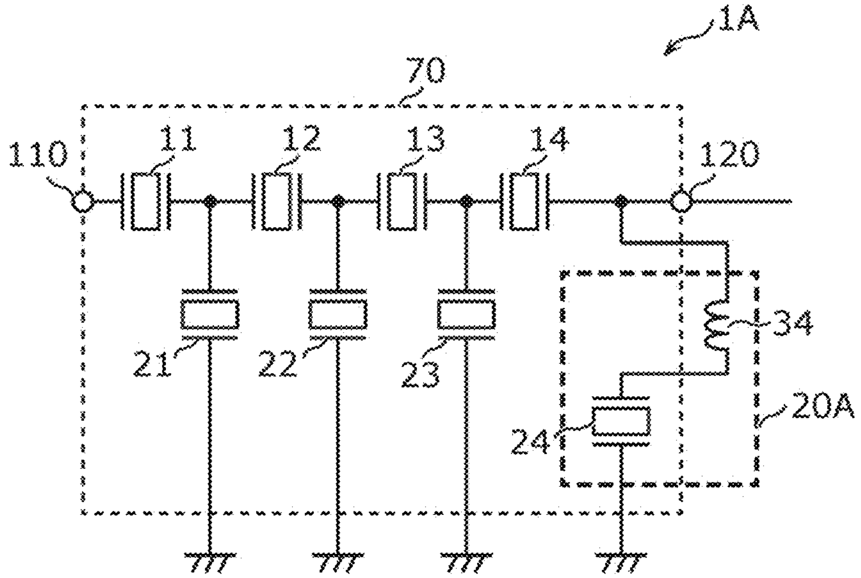
FIG. 5 is a diagram illustrating the circuit configuration of an acoustic wave filter according to a first modified example of an embodiment.

4 The Configuration of the Acoustic Wave Filter 1A according to a First Modified Example FIG. 5 is a diagram illustrating the circuit configuration of an acoustic wave filter 1A according to a first modified example of the embodiment. As illustrated in FIG. 5, the acoustic wave filter 1A according to the first modified example, which is a bandpass filter, includes the serial arm resonators 11, 12, 13, and 14, the parallel arm resonators 21, 22, 23, and 24, the inductor 34, and the input/output terminals 110 and 120. The acoustic wave filter 1A according to the present modified example is different from the acoustic wave filter 1 according to the embodiment in the configuration of a parallel-arm resonator device 20A. The acoustic wave filter 1A according to the present modified example will be described below by skipping the description about the same configurations as those of the acoustic wave filter 1 and mainly by focusing on different configurations.

The parallel arm resonator 24 and the inductor 34, which are connected in series to each other, form an acoustic-wave resonator device including an acoustic wave resonator, and constitute the parallel-arm resonator device 20A. The parallel-arm resonator device 20A is connected between the ground and the connection point between the serial arm resonator 14 and the input/output terminal 120. More specifically, the inductor 34 is connected to the serial arm path connecting the input/output terminals 110 and 120; the parallel arm resonator 24 is connected to the ground. The parallel arm resonator 24 is an exemplary second acoustic wave resonator; the inductor 34 is an exemplary first inductor; the parallel-arm resonator device 20A is an exemplary first parallel-arm resonator device.

The parallel-arm resonator device 20A has a resonant frequency frp20A (first resonant frequency) and an anti-resonant frequency fap20A (first anti-resonant frequency). The parallel arm resonator 24 has a resonant frequency frp24 and an anti-resonant frequency fap24. Serial connection of the inductor 34 to the parallel arm resonator 24 causes the resonant frequency frp20A of the parallel-arm resonator device 20A to shift to the lower frequency side of the resonant frequency frp24 of the parallel arm resonator 24. That is, serial connection of the inductor 34 to the parallel arm resonator 24 causes the resonant bandwidth (fap20A-frp20A) of the parallel-arm resonator device 20A to be broader than the resonant bandwidth (fap24-frp24) of the parallel arm resonator 24.

The resonant frequency frp24 of the parallel arm resonator 24 is positioned in the passband. In contrast, the resonant frequency frp20A of the parallel-arm resonator device 20A is lower than or equal to the low frequency end of the passband of the acoustic wave filter 1A. The anti-resonant frequency fap20A of the parallel-arm resonator device 20A is higher than or equal to the high frequency end of the passband. The frequency difference $\Delta fa$ between the anti-resonant frequency fap20A and the high frequency end of the passband is less than the frequency difference $\Delta fr$ between the resonant frequency frp20A and the low frequency end of the passband.

According to this, serial connection of the inductor 34 to the parallel arm resonator 24 causes the resonant bandwidth of the parallel-arm resonator device 20A to be extended for adjustment so that the passband is positioned between the resonant frequency frp20A and the anti-resonant frequency fap20A of the parallel-arm resonator device 20A. This causes the impedance in the passband of the parallel-arm resonator device 20A to be inductive. Without necessarily placement of an inductive matching circuit between the acoustic wave filter 1A and a capacitive circuit connected to the acoustic wave filter 1A, it is possible to match the impedance between the capacitive circuit and the acoustic wave filter 1A. The anti-resonant frequency fap20A having a high impedance is positioned closer to the passband than the resonant frequency frp20A having a low impedance is. Thus, signals in the passband may be transmitted from the input/output terminal 110 to the input/output terminal 120 with low loss. Further, the parallel-arm resonator device 20A has a high impedance in the DC region. Thus, the direct-current bias voltage (direct-current bias current), which is supplied to the low-noise amplifier 2, may be prevented from leaking to the acoustic wave filter 1A side, eliminating the necessity of a capacitor for DC cut which is disposed between the acoustic wave filter 1A and the low-noise amplifier 2. Therefore, a small, low-loss acoustic wave filter 1A, in which both the matching loss and the insertion loss are reduced, may be provided.

Figure 6A:
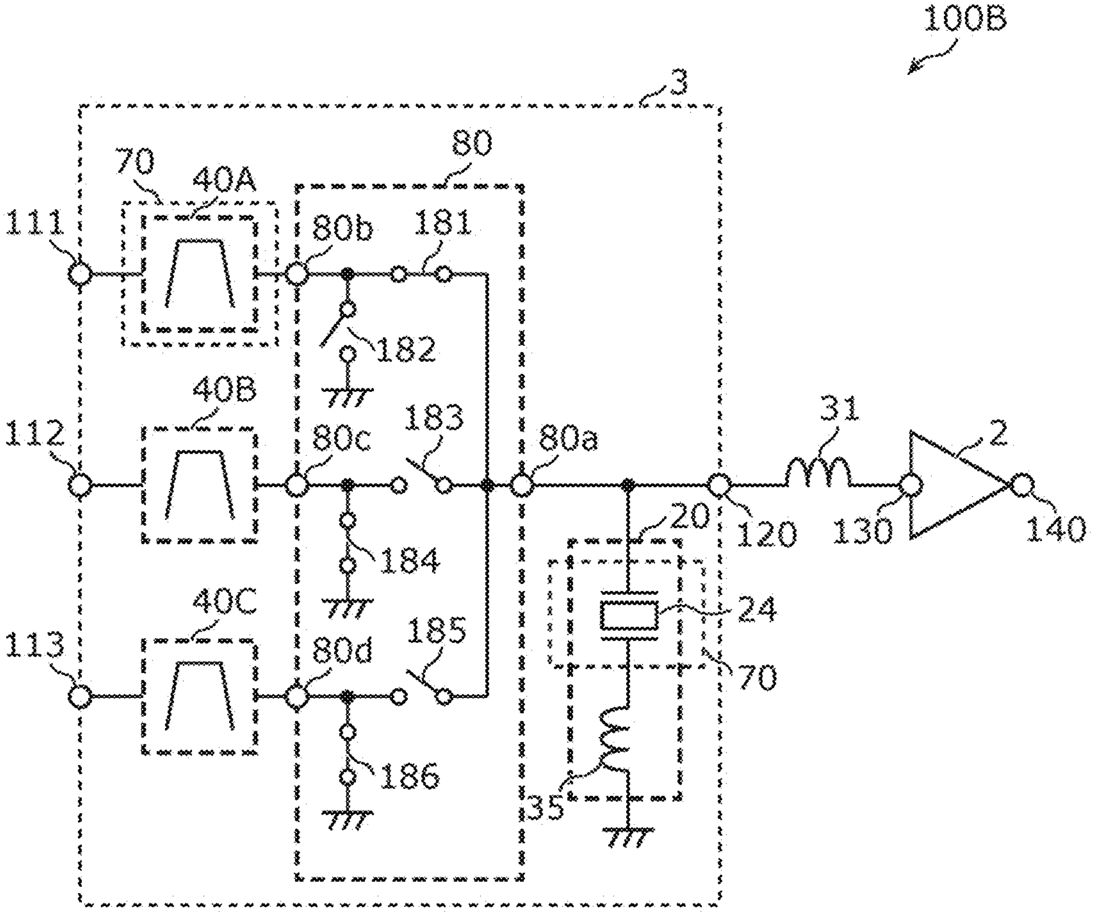
FIG. 6A is a diagram illustrating the circuit configuration of a filter circuit and a radio-frequency module according to a second modified example of an embodiment.

5 The Configuration of a Filter Circuit 3 and a Radio-Frequency Module 100B According to a Second Modified Example FIG. 6A is a diagram illustrating the circuit configuration of a filter circuit 3 and a radio-frequency module 100B according to a second modified example of the embodiment. As illustrated in FIG. 6A, the radio-frequency module 100B includes the filter circuit 3, the low-noise amplifier 2, and the inductor 31. The radio-frequency module 100B according to the present modified example is different from the radio-frequency module 100 according to the embodiment only in that the acoustic wave filter 1 is replaced with the filter circuit 3. The radio-frequency module 100B according to the present modified example will be described mainly by focusing on the filter circuit 3 different from the radio-frequency module 100 according to the embodiment.

The filter circuit 3 includes the parallel-arm resonator device 20, filter units 40A, 40B, and 40C, a switch circuit 80, and input/output terminals 111, 112, 113, and 120.

The parallel-arm resonator device 20 is an acoustic-wave resonator device including the parallel arm resonator 24 and an inductor 35 which are connected in series to each other. The parallel-arm resonator device 20 is connected between the ground and the connection point between the switch circuit 80 and the input/output terminal 120. The parallel arm resonator 24 is an exemplary second acoustic wave resonator; the inductor 35 is an exemplary first inductor; the parallel-arm resonator device 20 is an exemplary first parallel-arm resonator device.

The parallel-arm resonator device 20 has a resonant frequency frp20 (first resonant frequency) and an anti-resonant frequency fap20 (first anti-resonant frequency). The parallel arm resonator 24 has a resonant frequency frp24 and an anti-resonant frequency fap24. Serial connection of the inductor 35 to the parallel arm resonator 24 causes the resonant frequency frp20 of the parallel-arm resonator device 20 to shift to the low frequency side of the resonant frequency frp24 of the parallel arm resonator 24. That is, serial connection of the inductor 35 to the parallel arm resonator 24 causes the resonant bandwidth (fap20-frp20) of the parallel-arm resonator device 20 to be broader than the resonant bandwidth (fap24-frp24) of the parallel arm resonator 24.

The filter unit 40A, which is an exemplary, is connected, at its first end, to a selection terminal 80*b* of the switch circuit 80, and is connected, at its second end, to the input/output terminal 111. The filter unit 40A has a circuit configuration of the acoustic wave filter 1 according to the embodiment, excluding the parallel-arm resonator device 20, and includes the serial arm resonators 11, 12, 13, and 14 and the parallel arm resonators 21, 22, and 23. That is, the filter unit 40A and the parallel-arm resonator device 20, which are separated by the switch circuit 80, has the same circuit configuration as that of the acoustic wave filter 1 according to the embodiment.

The filter unit 40B, which is an exemplary first filter unit, is connected, at its first end, to a selection terminal 80*c* of the switch circuit 80, and is connected, at its second end, to the input/output terminal 112. The filter unit 40B has at least one of the following devices: an acoustic wave resonator; an inductor; a capacitor. The filter unit 40B and the parallel-arm resonator device 20 (first parallel-arm resonator device) form a first filter of the band-pass type through connection using the switch circuit 80.

The filter unit 40C is connected, at its first end, to a selection terminal 80*d* of the switch circuit 80, and is connected, at its second end, to the input/output terminal 113. The filter unit 40C has at least one of the following devices: an acoustic wave resonator; an inductor; a capacitor. The filter unit 40C and the parallel-arm resonator device 20 (first parallel-arm resonator device) form a bandpass filter through connection using the switch circuit 80.

All of the acoustic wave resonators (the serial arm resonators 11 to 14 and the parallel arm resonators 21 to 23), which are included in the filter unit 40A, and the parallel arm resonator 24, which is included in the parallel-arm resonator device 20, are formed on the same piezoelectric substrate 70. This achieves a reduction in size of the filter circuit 3.

When the filter units 40B and 40C have acoustic wave resonators, the acoustic wave resonators included in the filter units 40B and 40C may be also formed on the piezoelectric substrate 70.

The switch circuit 80, which is an exemplary first switch circuit, has switches 181, 182, 183, 184, 185, and 186, a common terminal 80*a*, the selection terminal 80*b* (first selection terminal), the selection terminal 80*c* (second selection terminal), and the selection terminal 80*d*. The switch circuit 80 switches among connection between the common terminal 80*a* and the selection terminal 80*b*, connection between the common terminal 80*a* and the selection terminal 80*c*, and connection between the common terminal 80*a* and the selection terminal 80*d*. The switch 181 is connected, at its first end, to the common terminal 80*a*, and is connected, at its second end, to the selection terminal 80*b*. The switch 183 is connected, at its first end, to the common terminal 80*a*, and is connected, at its second end, to the selection terminal 80*c*. The switch 185 is connected, at its first end, to the common terminal 80*a*, and is connected, at its second end, to the selection terminal 80*d*. The switch 182 is connected, at its first end, to the connection point between the second end of the switch 181 and the selection terminal 80*b*, and is connected, at its second end, to the ground. The switch 184 is connected, at its first end, to the connection point between the second end of the switch 183 and the selection terminal 80*c*, and is connected, at its second end, to the ground. The switch 186 is connected, at its first end, to the connection point between the second end of the switch 185 and the selection terminal 80*d*, and is connected, at its second end, to the ground.

In the configuration described above, when a radio frequency signal is to be transmitted from the input/output terminal 111 to the input/output terminal 120, the switches 181, 184, and 186 enter the conductive state, and the switches 182, 183, and 185 enter the nonconductive state, so that a connection between the filter unit 40A and the parallel-arm resonator device 20 is established. When a radio frequency signal is to be transmitted from the input/output terminal 112 to the input/output terminal 120, the switches 183, 182, and 186 enter the conductive state, and the switches 184, 181, and 185 enter the nonconductive state. When a radio frequency signal is to be transmitted from the input/output terminal 113 to the input/output terminal 120, the switches 185, 182, and 184 enter the conductive state, and the switches 186, 181, and 183 enter the nonconductive state.

In the filter circuit 3 according to the present modified example, the filter unit 40C is optional. In this case, the input/output terminal 113, the selection terminal 80*d*, the switches 185 and 186 are optional.

Figure 6B:
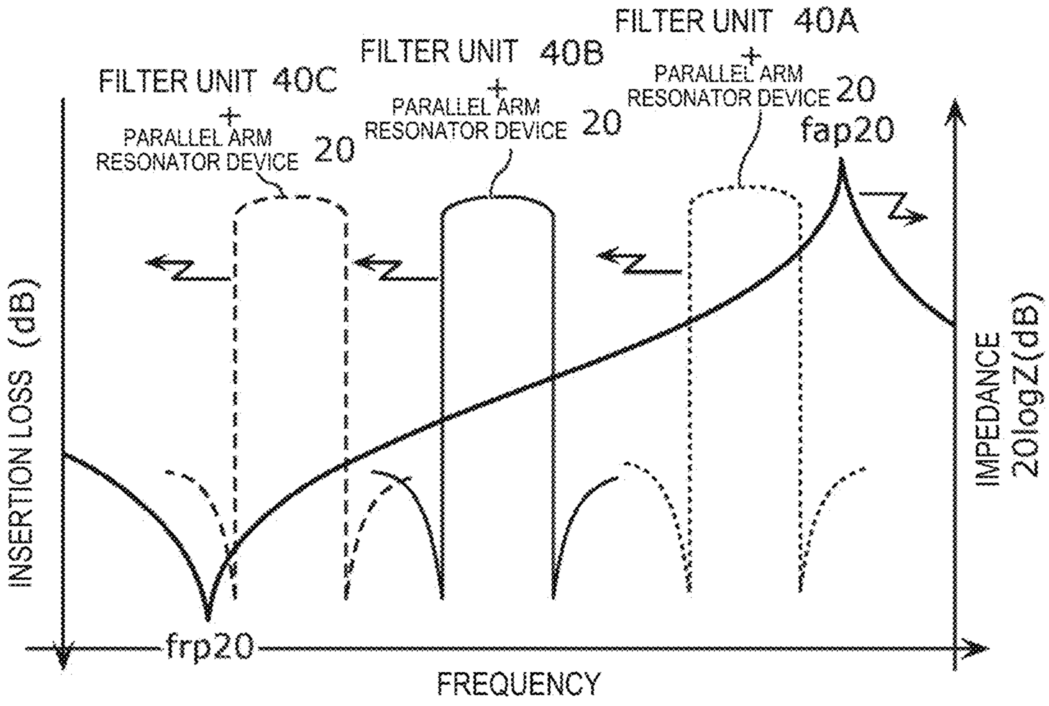
FIG. 6B is a schematic diagram illustrating the bandpass characteristics of filters included in a filter circuit and illustrating the impedance characteristics of a first parallel-arm resonator device, according to the second modified example of the embodiment.

FIG. 6B is a schematic diagram illustrating the bandpass characteristics of each filter, which is included in the filter circuit 3, and the impedance characteristics of the parallel-arm resonator device 20, according to the second modified example of the embodiment. As illustrated in FIG. 6B, the passband formed by the filter unit 40A and the parallel-arm resonator device 20, the passband formed by the filter unit 40B and the parallel-arm resonator device 20, and the passband formed by the filter unit 40C and the parallel-arm resonator device 20 are positioned in this sequence from the high frequency side.

The order of magnitude of the frequencies of the three passbands is not limited to the sequence described above. In addition, the three passbands may overlap each other at least partially.

As illustrated in FIG. 6B, the resonant frequency frp20 of the parallel-arm resonator device 20 is lower than or equal to the low frequency end of the lowest-frequency-side passband among the three passbands, and the anti-resonant frequency fap20 of the parallel-arm resonator device 20 is higher than or equal to the high frequency end of the highest-frequency-side passband among the three passbands.

According to this, either one or both of the resonant frequency frp24 and the anti-resonant frequency fap24 of the parallel arm resonator 24 formed on the piezoelectric substrate 70, on which the serial arm resonators 11 to 14 and the parallel arm resonators 21 to 23 of the filter unit 40A which form the passband are formed, are highly likely to be positioned in the passband. However, serial connection of the inductor 35 to the parallel arm resonator 24 causes the resonant bandwidth of the parallel-arm resonator device 20 to be extended for adjustment so that the three passbands are positioned between the resonant frequency frp20 and the anti-resonant frequency fap20 of the parallel-arm resonator device 20. Thus, the impedance, in the three passbands, of the parallel-arm resonator device 20 is inductive. Without necessarily placement of an inductive matching circuit between the filter circuit 3 and the low-noise amplifier 2 (a capacitive circuit) which is connected to the input/output terminal 120, it is possible to match the impedance between the low-noise amplifier 2 and the filter circuit 3. The parallel-arm resonator device 20 has a high impedance in the DC region. Thus, the direct-current bias voltage (direct-current bias current), which is supplied to the low-noise amplifier 2, may be prevented from leaking to the filter circuit 3 side, eliminating the necessity of a capacitor for DC cut which is disposed in series on the path connecting the filter circuit 3 to the low-noise amplifier 2. Therefore, the filter circuit 3 and the radio-frequency module 100B, which are small and have low loss, may be provided.

6 Effects and the Like

As described above, the acoustic wave filter 1 according to the present embodiment includes the serial arm resonator 14, which is disposed on the serial arm path connecting the input/output terminals 110 and 120, and the parallel-arm resonator device 20, which is connected between the serial arm path and the ground. The serial arm resonator 14 is the first acoustic wave resonator. The parallel-arm resonator device 20 includes the parallel arm resonator 24 and the inductor 34, which are connected in series between the serial arm path and the ground. The serial arm resonator 14 and the parallel arm resonator 24 are formed on the same piezoelectric substrate 70. The resonant frequency frp20 of the parallel-arm resonator device 20 is lower than or equal to the low frequency end of the passband of the acoustic wave filter 1. The anti-resonant frequency fap20 of the parallel-arm resonator device 20 is higher than or equal to the high frequency end of the passband. The frequency difference Δfa between the anti-resonant frequency fap20 and the high frequency end of the passband is less than the frequency difference Δfr between the resonant frequency frp20 and the low frequency end of the passband.

According to this, either one or both of the resonant frequency frp24 and the anti-resonant frequency fap24 of the parallel arm resonator 24 formed on the piezoelectric substrate 70, on which the serial arm resonator 14 forming the passband is formed, are highly likely to be positioned in the passband. However, serial connection of the inductor 34 to the parallel arm resonator 24 causes the resonant bandwidth of the parallel-arm resonator device 20 to be extended for adjustment so that the passband is positioned between the resonant frequency frp20 and the anti-resonant frequency fap20 of the parallel-arm resonator device 20. Thus, the impedance, in the passband, of the parallel-arm resonator device 20 is inductive. Without necessarily placement of an inductive matching circuit between the acoustic wave filter 1 and the low-noise amplifier 2 which is connected to the acoustic wave filter 1 and which has a capacitive impedance, it is possible to match the impedance between the capacitive circuit and the acoustic wave filter 1. In addition, the anti-resonant frequency fap20 having a high impedance is positioned closer to the passband than the resonant frequency frp20 having a low impedance is. Thus, a signal in the passband may be transmitted from the input/output terminal 110 to the input/output terminal 120 with low loss. Further, the parallel-arm resonator device 20 has a high impedance in the DC region. Thus, the direct-current bias voltage (direct-current bias current), which is supplied to the low-noise amplifier 2, may be prevented from leaking to the acoustic wave filter 1 side, eliminating the necessity of a capacitor for DC cut which is disposed in series on the path connecting the acoustic wave filter 1 to the low-noise amplifier 2. Therefore, the small, low-loss acoustic wave filter 1, in which both the matching loss and the insertion loss are reduced, may be provided.

In addition, for example, in the acoustic wave filter 1, the resonant frequency frp24 of the parallel arm resonator 24 is positioned in the passband.

This may lead to the state in which the resonant bandwidth of the parallel arm resonator 24 is less than the passband. Serial connection of the inductor 34 to the parallel arm resonator 24 enables the resonant bandwidth of the parallel-arm resonator device 20 to be broader. This enables the impedance, in the passband, of the parallel-arm resonator device 20 to be inductive by using the small parallel arm resonator 24.

In addition, for example, in the acoustic wave filter 1, all the acoustic wave resonators included in the acoustic wave filter 1 are formed on the piezoelectric substrate 70.

This achieves a reduction in size of the acoustic wave filter 1.

In addition, for example, the acoustic wave filter 1 includes multiple serial-arm resonator devices and multiple parallel-arm resonator devices. The parallel-arm resonator device 20 is connected closest to the input/output terminal 120 among the parallel-arm resonator devices.

According to this, the parallel-arm resonator device 20, which has an inductive impedance in the passband, is disposed closest to the input terminal 130 of the low-noise amplifier 2, having a capacitive impedance, among the parallel-arm resonator devices. This enables impedance matching between the acoustic wave filter 1 and the low-noise amplifier 2 to be made with high efficiency and high accuracy.

In addition, for example, in the acoustic wave filter 1, the parallel arm resonator 24 is connected to the serial arm path, and the inductor 34 is connected to the ground.

According to this, the parallel arm resonator 24 and the serial arm resonator 14 are formed on a single piezoelectric substrate 70. Thus, wiring connecting the parallel arm resonator 24 to the serial arm resonator 14 and wiring connecting the parallel arm resonator 24 to the inductor 34 may be made short, achieving the low-loss acoustic wave filter 1.

In addition, for example, in the acoustic wave filter 1A according to the first modified example, the parallel arm resonator 24 is connected to the ground, and the inductor 34 is connected to the serial arm path.

In addition, for example, the filter circuit 3 according to the second modified example includes the acoustic wave filter 1 (or 1A), and the first filter of the band-pass type, and the switch circuit 80, which has the common terminal 80*a* and the selection terminals 80*b* and 80*c* and which switches between connection between the common terminal 80*a* and the selection terminal 80*b* and connection between the common terminal 80*a* and the selection terminal 80*c*. The acoustic wave filter 1 has the parallel-arm resonator device 20 and the filter unit 40A. The first filter has the parallel-arm resonator device 20 and the filter unit 40B. The parallel-arm resonator device 20 is connected to the common terminal 80*a*. The filter unit 40A is connected to the selection terminal 80*b*. The filter unit 40B is connected to the selection terminal 80*c*. The resonant frequency frp20 is lower than or equal to the low frequency end of the lower frequency side between the low frequency end of the passband of the acoustic wave filter 1 and the low frequency end of the passband of the first filter. The anti-resonant frequency fap20 is higher than or equal to the high frequency end of the higher frequency side between the high frequency end of the passband of the acoustic wave filter 1 and the high frequency end of the passband of the first filter.

According to this, either one or both of the resonant frequency frp24 and the anti-resonant frequency fap24 of the parallel arm resonator 24 formed on the piezoelectric substrate 70, on which the serial arm resonator 14 of the filter unit 40A forming the passband is formed, are highly likely to be positioned in the passband. However, serial connection of the inductor 35 to the parallel arm resonator 24 causes the resonant bandwidth of the parallel-arm resonator device 20 to be extended for adjustment so that the passband of the acoustic wave filter 1 and the passband of the first filter are positioned between the resonant frequency frp20 and the anti-resonant frequency fap20 of the parallel-arm resonator device 20. This causes the impedance, in the two passbands, of the parallel-arm resonator device 20 to be inductive. Without necessarily placement of an inductive matching circuit between the low-noise amplifier 2 (capacitive circuit) and the filter circuit 3 which are connected to the input/output terminal 120, it is possible to match the impedance between the low-noise amplifier 2 and the filter circuit 3. In addition, the parallel-arm resonator device 20 has a high impedance in the DC region. Thus, the direct-current bias voltage (direct-current bias current), which is supplied to the low-noise amplifier 2, may be prevented from leaking to the filter circuit 3 side, eliminating the necessity of a capacitor for DC cut which is disposed in series on the path connecting the filter circuit 3 to the low-noise amplifier 2. Therefore, a small, low-loss filter circuit 3 may be provided.

In addition, for example, the radio-frequency module 100 according to the embodiment includes the acoustic wave filter 1 and the low-noise amplifier 2 whose input terminal 130 is connected to the input/output terminal 120.

According to this, the direct-current bias voltage (direct-current bias current), which is supplied to the low-noise amplifier 2, may be prevented from leaking to the acoustic wave filter 1 side, eliminating the necessity of a capacitor for DC cut which is disposed in series on the path connecting the acoustic wave filter 1 to the low-noise amplifier 2. Therefore, a small, low-loss radio-frequency module 100, in which both the matching loss and the insertion loss are reduced, may be provided.

In addition, for example, in the radio-frequency module 100, a capacitor is not disposed in series on the path connecting the input/output terminal 120 to the input end of the amplifier transistor included in the low-noise amplifier 2.

This achieves a reduction in size of the radio-frequency module 100.

In addition, for example, the radio-frequency module 100B according to the second modified example includes the filter circuit 3 and the low-noise amplifier 2 whose input terminal 130 is connected to the connection point between the common terminal 80*a* and the parallel-arm resonator device 20.

According to this, the direct-current bias voltage (direct-current bias current), which is supplied to the low-noise amplifier 2, may be prevented from leaking to the filter circuit 3 side, eliminating the necessity of a capacitor for DC cut which is disposed in series on the path connecting the filter circuit 3 to the low-noise amplifier 2. Therefore, a small, low-loss radio-frequency module 100B, in which both the matching loss and the insertion loss are reduced, may be provided.

In addition, for example, in the radio-frequency module 100B, a capacitor is not disposed in series on the path connecting the connection point to the input terminal 130 of the low-noise amplifier 2.

This achieves a reduction in size of the radio-frequency module 100B.

Other Embodiments

The acoustic wave filter, the filter circuit, and the radio-frequency module provided by the present disclosure are described above by taking the embodiment and the modified examples as examples. However, the present disclosure is not limited to the embodiment and the modified examples. Modified examples, which are obtained by making various modifications, which are conceived by those skilled in the art without necessarily departing from the gist of the present disclosure, on the embodiment and the modified examples, and various devices, which include the acoustic wave filter, the filter circuit, and the radio-frequency module provided by the present disclosure, are also encompassed in the present disclosure.

In addition, for example, in the acoustic wave filter, the filter circuit, and the radio-frequency module according to the embodiment and the modified examples, a matching device, such as an inductor or a capacitor, and a switch circuit may be connected between the components.

The features of the acoustic wave filter, the filter circuit, and the radio-frequency module described on the basis of the embodiment and the modified examples will be described below.

<1> An acoustic wave filter of band-pass type, the filter comprising:
a first serial-arm resonator device disposed on a serial arm path connecting a first input/output terminal and a second input/output terminal; and
a first parallel-arm resonator device connected between the serial arm path and a ground,
wherein the first serial-arm resonator device includes a first acoustic wave resonator,
wherein the first parallel-arm resonator device includes a second acoustic wave resonator and a first inductor which are connected in series between the serial arm path and the ground,
wherein the first acoustic wave resonator and the second acoustic wave resonator are formed on an identical piezoelectric substrate,
wherein a first resonant frequency is lower than or equal to a low frequency end of a passband of the acoustic wave filter, the first resonant frequency being a resonant frequency of the first parallel-arm resonator device, and a first anti-resonant frequency is higher than or equal to a high frequency end of the passband, the first anti-resonant frequency being an anti-resonant frequency of the first parallel-arm resonator device, and
wherein a frequency difference between the first anti-resonant frequency and the high frequency end of the passband is less than a frequency difference between the first resonant frequency and the low frequency end of the passband.

<2> The acoustic wave filter according to <1>,
wherein a resonant frequency of the second acoustic wave resonator is positioned in the passband.

<3> The acoustic wave filter according to <1> or <2>, further comprising:
a plurality of serial-arm resonator devices that include the first serial-arm resonator device; and
a plurality of parallel-arm resonator devices that include the first parallel-arm resonator device,
wherein each of the plurality of serial-arm resonator devices and the plurality of parallel-arm resonator devices includes an acoustic wave resonator, and
wherein all the acoustic wave resonators included in the acoustic wave filter are formed on the piezoelectric substrate.

<4> The acoustic wave filter according to <1> or <2>, further comprising:
a plurality of serial-arm resonator devices that include the first serial-arm resonator device; and
a plurality of parallel-arm resonator devices that include the first parallel-arm resonator device,
wherein the first parallel-arm resonator device is connected closest to the first input/output terminal among the plurality of parallel-arm resonator devices.

<5> The acoustic wave filter according to any one of <1> to <4>,
wherein the second acoustic wave resonator is connected to the serial arm path, and the first inductor is connected to the ground.

<6> The acoustic wave filter according to any one of <1> to <4>,
wherein the second acoustic wave resonator is connected to the ground, and the first inductor is connected to the serial arm path.

<7> A filter circuit comprising:
the acoustic wave filter according to any one of <1> to <6>;
a first filter of band-pass type; and
a first switch circuit that has a common terminal, a first selection terminal, and a second selection terminal, and that switches between connection between the common terminal and the first selection terminal and connection between the common terminal and the second selection terminal,
wherein the acoustic wave filter has the first parallel-arm resonator device and an acoustic-wave filter unit,
wherein the first filter has the first parallel-arm resonator device and a first filter unit,
wherein the first parallel-arm resonator device is connected to the common terminal,
wherein the acoustic-wave filter unit is connected to the first selection terminal,
wherein the first filter unit is connected to the second selection terminal, and
wherein the first resonant frequency is lower than or equal to a low frequency end of a lower frequency side between the low frequency end of the passband of the acoustic wave filter and a low frequency end of a passband of the first filter, and the first anti-resonant frequency is higher than or equal to a high frequency end of a higher frequency side between the high frequency end of the passband of the acoustic wave filter and a high frequency end of the passband of the first filter.

<8> A radio-frequency module comprising:
the acoustic wave filter according to any one of <1> to <6>; and
a low-noise amplifier that has an input terminal connected to the first input/output terminal.

<9> The radio-frequency module according to <8>,
wherein a capacitor is not disposed in series on a path connecting the first input/output terminal to an input end of an amplifier transistor included in the low-noise amplifier.

<10> A radio-frequency module comprising:
the filter circuit according to <7>; and
a low-noise amplifier that has an input terminal connected to a connection point between the common terminal and the first parallel-arm resonator device.

<11> The radio-frequency module according to <10>,
wherein a capacitor is not disposed in series on a path connecting the input terminal to the connection point.

The present disclosure may be used broadly in communication devices such as a cellular phone as an acoustic wave filter, a filter circuit, and a radio-frequency module which have low loss and which are applicable to a multiband frequency standard.

What is claimed is:

1. A band-pass acoustic wave filter, the band-pass acoustic wave filter comprising:
a first serial-arm resonator device in a serial arm path, the serial arm path connecting a first input/output terminal and a second input/output terminal; and a first parallel-arm resonator device connected between the serial arm path and ground, wherein the first serial-arm resonator device comprises a first acoustic wave resonator, wherein the first parallel-arm resonator device comprises a second acoustic wave resonator and a first inductor connected in series between the serial arm path and ground, wherein the first acoustic wave resonator and the second acoustic wave resonator are on a same piezoelectric substrate, wherein a first resonant frequency is lower than or equal to a low frequency end of a passband of the acoustic wave filter, the first resonant frequency being a resonant frequency of the first parallel-arm resonator device, wherein a first anti-resonant frequency is higher than or equal to a high frequency end of the passband, the first anti-resonant frequency being an anti-resonant frequency of the first parallel-arm resonator device, and wherein a frequency difference between the first anti-resonant frequency and the high frequency end of the passband is less than a frequency difference between the first resonant frequency and the low frequency end of the passband.

2. The acoustic wave filter according to claim 1, wherein a resonant frequency of the second acoustic wave resonator is in the passband.

3. The acoustic wave filter according to claim 1, further comprising:

a plurality of serial-arm resonator devices including the first serial-arm resonator device; and a plurality of parallel-arm resonator devices including the first parallel-arm resonator device, wherein each of the plurality of serial-arm resonator devices and the plurality of parallel-arm resonator devices comprises an acoustic wave resonator, and wherein all the acoustic wave resonators included in the acoustic wave filter are on the same piezoelectric substrate.

4. The acoustic wave filter according to claim 1, further comprising:

a plurality of serial-arm resonator devices including the first serial-arm resonator device; and a plurality of parallel-arm resonator devices including the first parallel-arm resonator device, wherein, among the plurality of parallel-arm resonator devices, the first parallel-arm resonator device is connected closest to the first input/output terminal.

5. The acoustic wave filter according to claim 1, wherein the second acoustic wave resonator is connected to the serial arm path, and the first inductor is connected to ground.

6. The acoustic wave filter according to claim 1, wherein the second acoustic wave resonator is connected to ground, and the first inductor is connected to the serial arm path.

7. A filter circuit comprising:

the acoustic wave filter according to claim 1;

a first band-pass filter; and a first switch circuit that has a common terminal, a first selection terminal, and a second selection terminal, and that is configured to selectively switch connection of the common terminal between the first selection terminal and the second selection terminal, wherein the acoustic wave filter comprises the first parallel-arm resonator device and an acoustic-wave filter unit, wherein the first filter comprises the first parallel-arm resonator device and a first filter unit, wherein the first parallel-arm resonator device is connected to the common terminal, wherein the acoustic-wave filter unit is connected to the first selection terminal, wherein the first filter unit is connected to the second selection terminal, wherein the first resonant frequency is lower than or equal to a low frequency end of a lower frequency side between the low frequency end of the passband of the acoustic wave filter and a low frequency end of a passband of the first filter, and wherein the first anti-resonant frequency is higher than or equal to a high frequency end of a higher frequency side between the high frequency end of the passband of the acoustic wave filter and a high frequency end of the passband of the first filter.

8. A radio-frequency module comprising:

the acoustic wave filter according to claim 1; and a low-noise amplifier that has an input terminal connected to the first input/output terminal.

9. The radio-frequency module according to claim 8, wherein the low-noise amplifier comprises an amplifier transistor, and wherein a capacitor is not disposed in series on a path connecting the first input/output terminal to an input end of the amplifier transistor.

10. A radio-frequency module comprising:

the filter circuit according to claim 7; and a low-noise amplifier that has an input terminal connected to a node between the common terminal and the first parallel-arm resonator device.

11. The radio-frequency module according to claim 10, wherein a capacitor is not disposed in series on a path connecting the input terminal to the node.

* * * * *